United States Patent
Pekola et al.

(10) Patent No.: US 12,209,918 B2
(45) Date of Patent: Jan. 28, 2025

(54) ULTRA-FAST COULOMB BLOCKADE THERMOMETER

(71) Applicant: Aalto University Foundation sr, Aalto (FI)

(72) Inventors: Jukka Pekola, Aalto (FI); Yu-Cheng Chang, Aalto (FI); Bayan Karimi, Aalto (FI); Joonas Peltonen, Aalto (FI)

(73) Assignee: Aalto University Foundation sr, Aalto (FI)

( * ) Notice: Subject to any disclaimer, the term of this patent is extended or adjusted under 35 U.S.C. 154(b) by 402 days.

(21) Appl. No.: 17/847,204

(22) Filed: Jun. 23, 2022

(65) Prior Publication Data

US 2022/0412812 A1     Dec. 29, 2022

(30) Foreign Application Priority Data

Jun. 24, 2021    (FI) ..................... 20217118

(51) Int. Cl.
*G01K 7/01*     (2006.01)
*G01R 27/02*    (2006.01)

(52) U.S. Cl.
CPC ............. *G01K 7/01* (2013.01); *G01R 27/02* (2013.01)

(58) Field of Classification Search
CPC .................................. G01K 7/01; G01R 27/02
See application file for complete search history.

(56) References Cited

U.S. PATENT DOCUMENTS

| | | | | | |
|---|---|---|---|---|---|
| 6,008,685 | A | * | 12/1999 | Kunst | ..................... G01K 7/01 327/512 |
| 2003/0173498 | A1 | * | 9/2003 | Blais | ..................... B82Y 10/00 257/E39.015 |
| 2006/0274813 | A9 | * | 12/2006 | Chen | .................. G01K 11/3213 374/161 |
| 2009/0309229 | A1 | * | 12/2009 | Angus | ................. H01L 29/7613 257/773 |
| 2019/0094079 | A1 | * | 3/2019 | Elsayed | .................... G05F 1/56 |
| 2020/0313063 | A1 | * | 10/2020 | Pollanen | .................. H01P 3/06 |

OTHER PUBLICATIONS

Bergsten et al: A fast, primary Coulomb blockade thermometer. Appl. Phys. Lett., 2001, vol. 78, 1264.

(Continued)

*Primary Examiner* — Akm Zakaria
(74) *Attorney, Agent, or Firm* — Laine IP Oy

(57) ABSTRACT

According to an example aspect of the present invention, there is provided a Coulomb blockade thermometer, comprising a Coulomb blockade thermometer sensor element, a radio-frequency generator configured to feed a radio-frequency signal to a first port of the Coulomb blockade thermometer, and a radio-frequency sensor configured to measure a response of the Coulomb blockade thermometer to the radio-frequency signal from a second port of the Coulomb blockade thermometer to perform a conductance measurement of the Coulomb blockade thermometer, and a bias voltage generator configured to sweep through a bias voltage range during the conductance measurement, performed using the radio-frequency generator, of the Coulomb blockade thermometer.

11 Claims, 4 Drawing Sheets

(56) References Cited

OTHER PUBLICATIONS

Karimi et al: Noninvasive Thermometer Based on the Zero-Bias Anomaly of a Superconducting Junction for Ultrasensitive Calorimetry. Phys. Rev. Applied, 2018, vol. 10, 054048.
Meschke et al: Accurate Coulomb Blockade Thermometry up to 60 Kelvin. Phil. Trans. R. Soc., 2016, A 374, 20150052.
Pekola et al: Thermometry by Arrays of Tunnel Junctions. Phys. Rev. Lett., 1994, vol. 73, 2903.
Sarsby et al: 500 microkelvin nanoelectronics. Nat. Commun., 2020, vol. 11, 1492.

* cited by examiner

US 12,209,918 B2

ULTRA-FAST COULOMB BLOCKADE THERMOMETER

FIELD

The present disclosure relates to a fast measurement of a Coulomb blockade thermometer.

BACKGROUND

Coulomb blockade thermometers, CBTs, are known since 1994 [1] and they have been developed since then into multipurpose calibration-free thermometers for a wide temperature range (0.0005-60 K in different measurements) [2,3]. The sensor technique as such is mature apart from precise material choices in various applications.

SUMMARY

According to some aspects, there is provided the subject-matter of the independent claims. Some embodiments are defined in the dependent claims.

According to a first aspect of the present disclosure, there is provided a Coulomb blockade thermometer, comprising a Coulomb blockade thermometer sensor element, a radio-frequency generator configured to feed a radio-frequency signal to a first port of the Coulomb blockade thermometer, and a radio-frequency sensor configured to measure a response of the Coulomb blockade thermometer to the radio-frequency signal from a second port of the Coulomb blockade thermometer to perform a conductance measurement of the Coulomb blockade thermometer, and a bias voltage generator configured to sweep through a bias voltage range during the conductance measurement, performed using the radio-frequency generator, of the Coulomb blockade thermometer.

According to a second aspect of the present disclosure, there is provided a method comprising performing a temperature measurement using a Coulomb blockade thermometer which comprises a Coulomb blockade thermometer sensor element, wherein the performing of the temperature measurement comprises providing a radio-frequency signal to a first port of the Coulomb blockade thermometer and recording a response of the Coulomb blockade thermometer to the radio-frequency signal from a second port of the Coulomb blockade thermometer to perform a conductance measurement of the Coulomb blockade thermometer, wherein during the temperature measurement a bias voltage of the Coulomb blockade thermometer is swept once across a bias voltage range.

EMBODIMENTS

Herein is proposed a solution to a drawback in previous measurements. A reliable determination of absolute temperature by CBT requires measurement of the full current-voltage, or precisely conductance G vs voltage V measurement over a sufficiently wide V range. In a standard conductance measurement this takes typically minutes, which is not acceptable in applications where relatively fast variations of temperature are monitored. A slow measurement is also prone to drifts and low frequency noise.

We propose a radiofrequency transmission measurement to determine the conductance of the CBT sensor. A version of the tank circuit design of the measurement is shown in FIG. 1. Transmission from port 1 to port 2 at a typical frequency of about 600 MHz probes the conductance of the junction. In the linear regime with low conductance one may write the transmission as $S\_21=S\_0-k\,G$, where $S\_0$ and k are constants determined by the circuit parameters. One can easily by elementary circuit analysis find expressions relating $S\_21$ and G beyond this linear regime as well [5]. For CBT which has small variations of conductance the linearized form is typically sufficient. A possibility to realize the L and C elements in the circuit is by (superconducting) spiral inductors which have natural self-capacitance. The DC voltage can be applied via a bias-T as shown in grey colour in FIG. 1.

Figure 2:
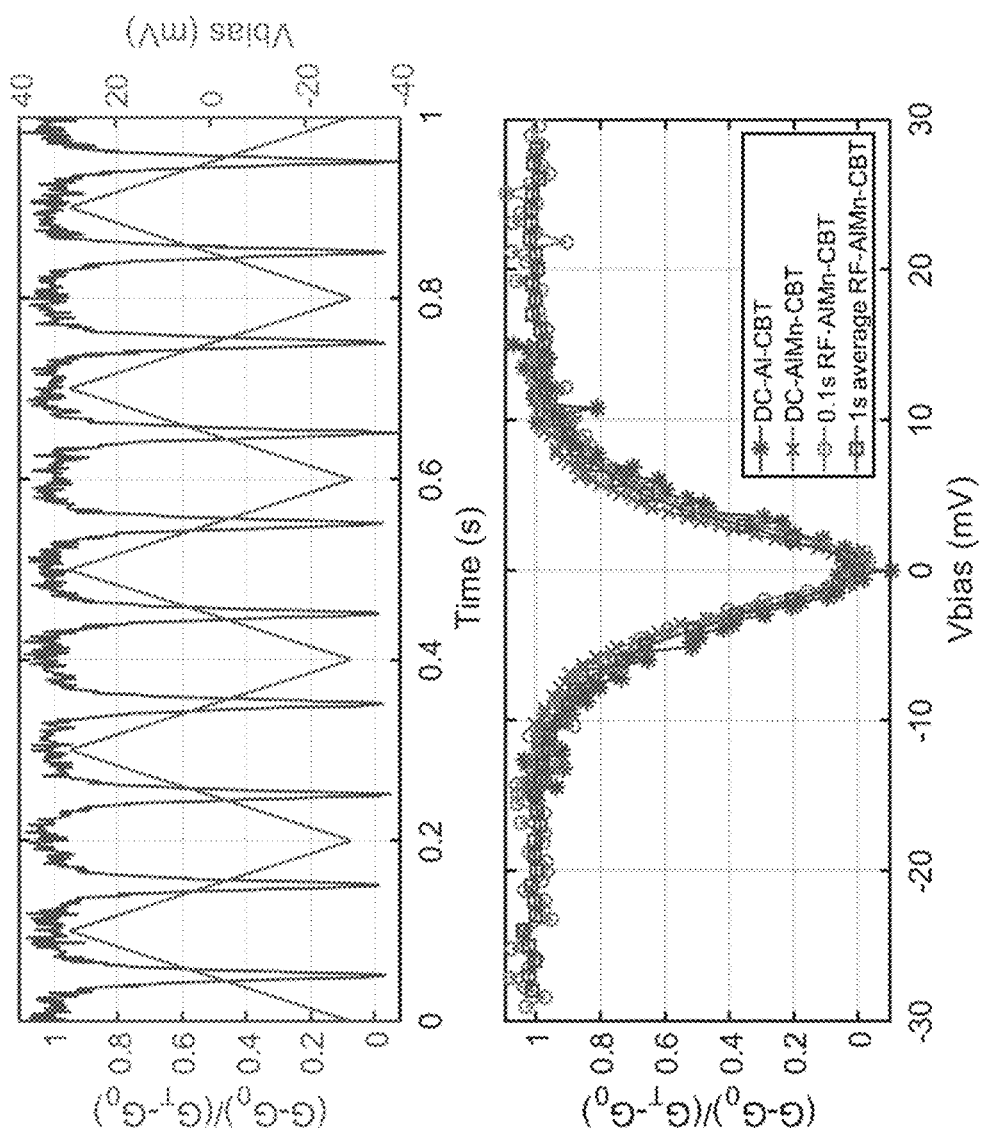
FIG. 2 illustrates real time measurements of normalized conductance of CBT vs. time with 10 measurements over a one second time scale, and a comparison of the traditional DC measurement of two different types of CBT sensors together with the new RF measurements.

Typically, the quality factor of the resonator with a sensor impedance in the 10 kOhm range is about 100. This means that the bandwidth of the measurement exceeds 1 MHz, which does not limit the speed of the measurement. FIG. 2 demonstrates the measurement of the full conductance vs V curve with the measurement time shorter than 0.1 s. The figure also shows the comparison of DC and RF measurements, properly normalized on the vertical scale. Equal shape and width of the peak demonstrate that the proposed fast measurement yields a CBT thermometer whose absolute temperature readout is more than 1000 times faster than in the earlier realizations.

Figure 1A:
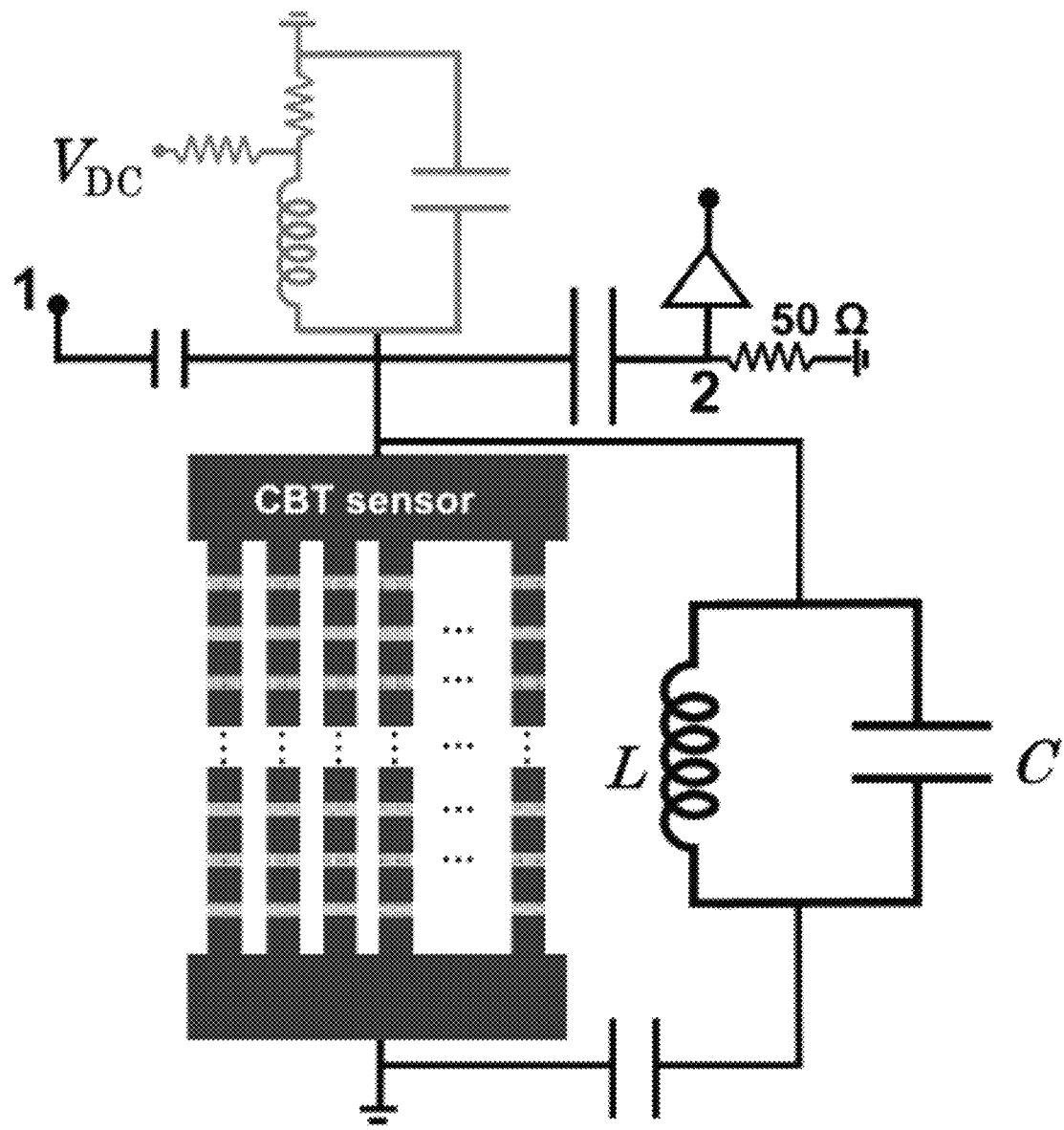
FIG. 1A illustrates an exemplary tank circuit used for the fast measurement of a CBT thermometer in accordance with at least some embodiments of the present invention.
Figure 1B:
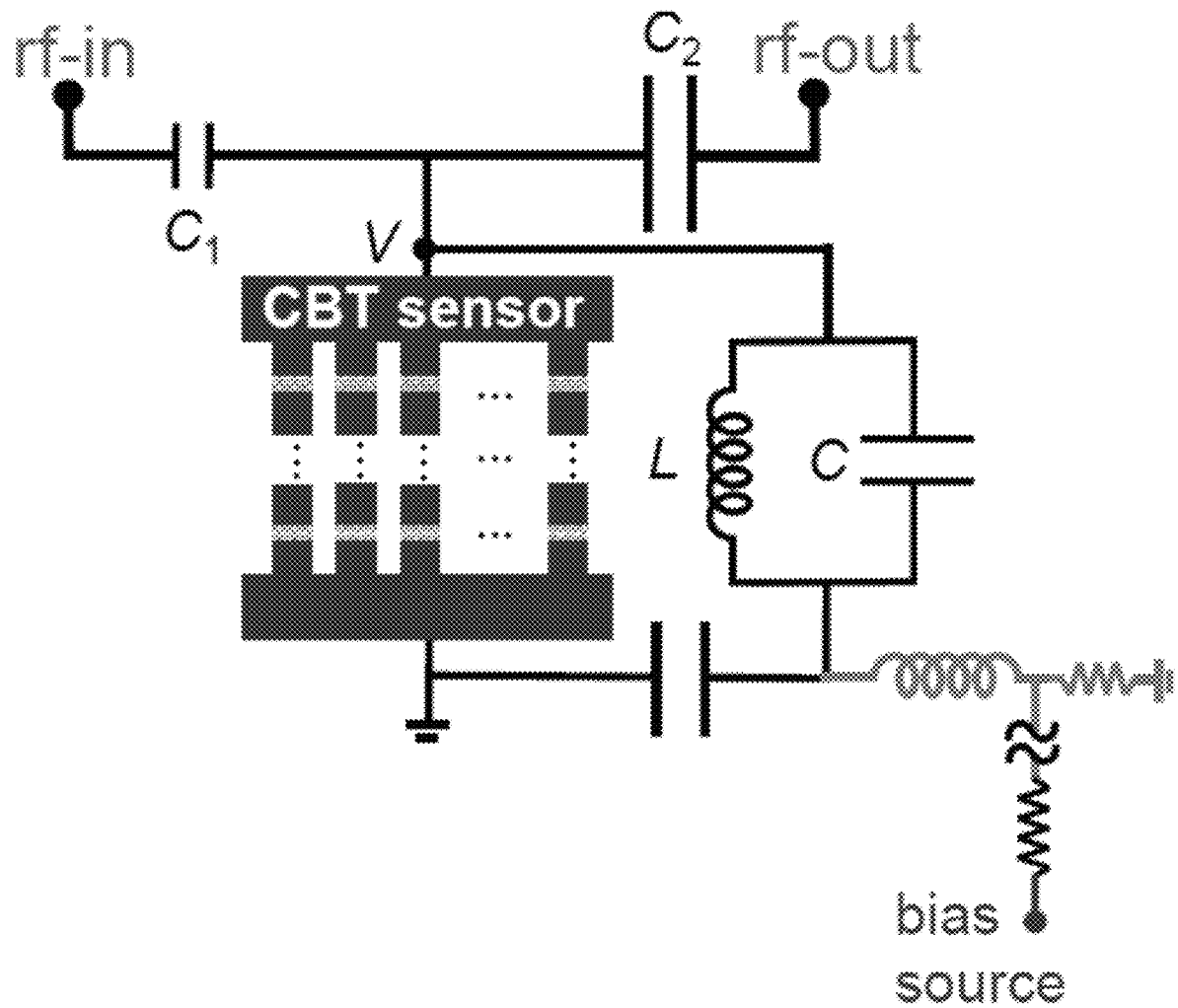
FIG. 1B illustrates an exemplary tank circuit used for the fast measurement of a CBT thermometer in accordance with at least some embodiments of the present invention.
Figure 1C:
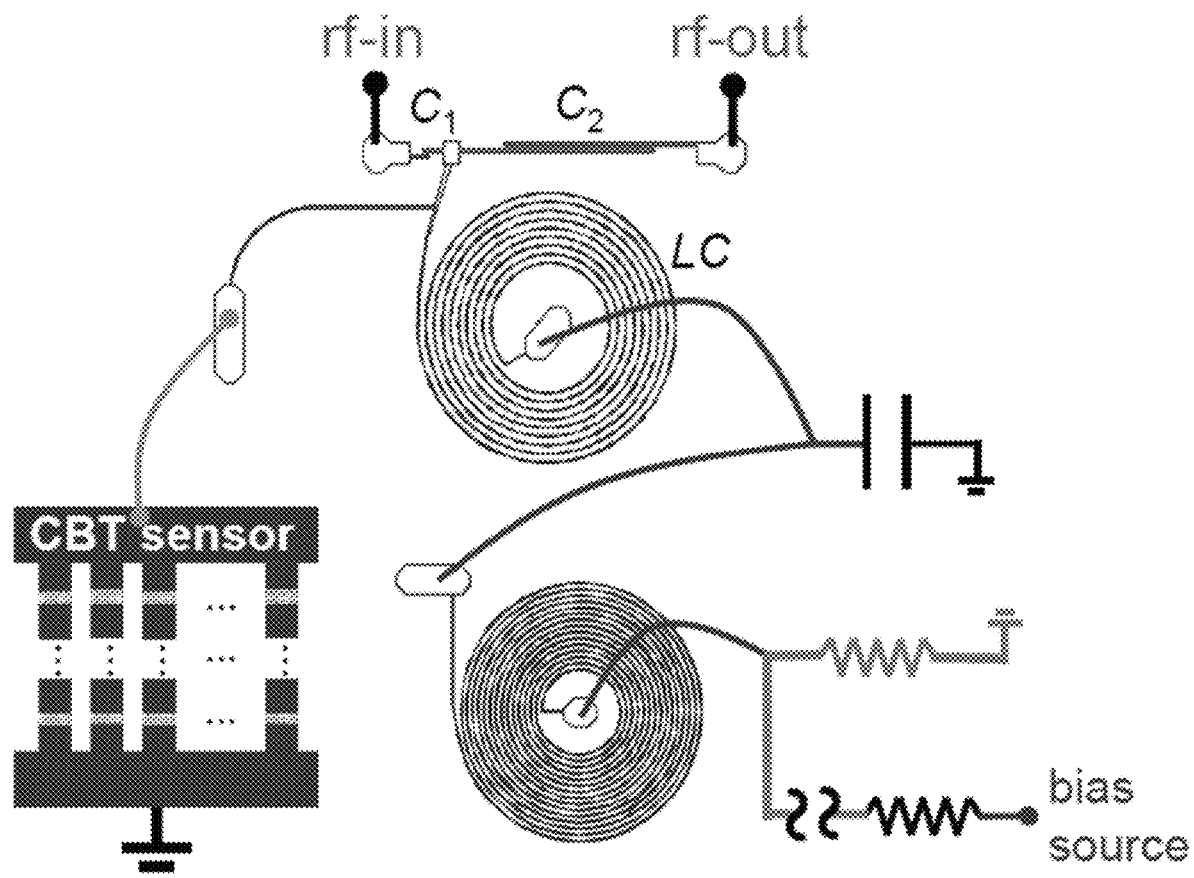
FIG. 1C illustrates an exemplary tank circuit used for the fast measurement of a CBT thermometer in accordance with at least some embodiments of the present invention.

FIG. 1A illustrates an exemplary tank circuit used for the fast measurement of a CBT thermometer in accordance with at least some embodiments of the present invention. The sensor consists of series connected tunnel junctions that are the grey connections between dark conducting islands. The transmission $S\_21$ between ports 1 and 2 gives the voltage dependent conductance of the CBT sensor.

FIG. 2 illustrates real time measurements of normalized conductance of CBT vs. time with 10 measurements over a one second time scale, and a comparison of the traditional DC measurement of two different types of CBT sensors together with the new RF measurements. The comparison shows that the temperature reading (the width of the dip) and the shape in the RF readout follows that in the traditional DC measurement. In the upper part of the figure, the horizontal axis corresponds to time, ranging from zero at the left edge to one second at the right-hand edge. On the vertical axis is a property $(G-G_0)/(G_T-G_0)$. The vertical axis ranges from zero at the bottom to 1 at the top. The orange curve on the vertical axis, visible as a triangular pattern, denotes the bias voltage, Vbias, ranging from −0.03 to +0.03 milliVolts. For each measurement, the bias voltage is swept across its range, from minimum to maximum or from maximum to minimum.

The bottom part of FIG. 2 has the same vertical axis as the top part, with Vbias, in milliVolts, on the horizontal axis ranging from −30 to +30 at the right.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in measurement of temperatures.

Acronyms List

CBT Coulomb blockade thermometer

CITATION LIST

[1] J. P. Pekola, K. P. Hirvi, J. P. Kauppinen, and M. A. Paalanen, Thermometry by Arrays of Tunnel Junctions, Phys. Rev. Lett. 73, 2903 (1994).
[2] Matthew Sarsby, Nikolai Yurttagul, and Attila Geresdi, 500 microkelvin nanoelectronics, Nat. Commun. 11, 1492 (2020).
[3] M. Meschke, A. Kemppinen, and J. P. Pekola, Accurate Coulomb Blockade Thermometry up to 60 Kelvin, Phil. Trans. R. Soc. A 374, 20150052 (2016).
[4] A potential speedup was proposed in Ref. [T. Bergsten and P. Delsing, A fast, primary Coulomb blockade thermometer, Appl. Phys. Lett. 78, 1264 (2001).] by finding the inflection point of the conductance curve. Yet self-heating, non-idealities in sensor, and low temperature corrections to the basic expressions of the conductance vs V have strong influence on the temperature reading in this measurement. Quantitative figures of the speed of the measurement were not presented.
[5] Bayan Karimi and Jukka P. Pekola, Noninvasive Thermometer Based on the Zero-Bias Anomaly of a Superconducting Junction for Ultrasensitive calorimetry, Phys. Rev. Applied 10, 054048 (2018).

The invention claimed is:

1. A Coulomb blockade thermometer, comprising:
a Coulomb blockade thermometer sensor element;
a radio-frequency generator configured to feed a radio-frequency signal to a first port of the Coulomb blockade thermometer, and a radio-frequency sensor configured to measure a response of the Coulomb blockade thermometer to the radio-frequency signal from a second port of the Coulomb blockade thermometer to perform a conductance measurement of the Coulomb blockade thermometer; and
a bias voltage generator configured to sweep through a bias voltage range during the conductance measurement, performed using the radio-frequency generator, of the Coulomb blockade thermometer.

2. The Coulomb blockade thermometer according to claim 1, wherein the Coulomb blockade thermometer sensor element comprising a series of connected tunnel junctions.

3. The Coulomb blockade thermometer according to claim 1, wherein the radio-frequency signal has a frequency of 600 megahertz.

4. The Coulomb blockade thermometer according to claim 1, wherein the conductance measurement is performed in less than 0.2 seconds.

5. The Coulomb blockade thermometer according to claim 1, wherein the conductance measurement is performed in less than 0.15 seconds.

6. The Coulomb blockade thermometer according to claim 1, wherein the conductance measurement is performed in 0.1 seconds.

7. A method comprising:
performing a temperature measurement using a Coulomb blockade thermometer which comprises a Coulomb blockade thermometer sensor element, wherein the performing of the temperature measurement comprises providing a radio-frequency signal to a first port of the Coulomb blockade thermometer and recording a response of the Coulomb blockade thermometer to the radio-frequency signal from a second port of the Coulomb blockade thermometer to perform a conductance measurement of the Coulomb blockade thermometer, wherein during the temperature measurement a bias voltage of the Coulomb blockade thermometer is swept once across a bias voltage range.

8. The method according to claim 7, wherein the conductance measurement is performed in less than 0.2 seconds.

9. The method according to claim 7, wherein the conductance measurement is performed in less than 0.15 seconds.

10. The method according to claim 7, wherein the conductance measurement is performed in 0.1 seconds.

11. The method according to claim 7, wherein the radio-frequency signal has a frequency of 600 megahertz.

\* \* \* \* \*